(12) United States Patent
Hsu

(10) Patent No.: US 7,592,658 B2
(45) Date of Patent: Sep. 22, 2009

(54) METHOD OF FORMING A SEMICONDUCTOR DEVICE HAVING A CAPACITOR AND A RESISTOR

(75) Inventor: Hsiu-Wen Hsu, Sinfong Township, Hsinchu County (TW)

(73) Assignee: EPISIL Technologies, Inc., Hsin-Chu (TW)

( * ) Notice: Subject to any disclaimer, the term of this patent is extended or adjusted under 35 U.S.C. 154(b) by 70 days.

(21) Appl. No.: 12/011,074

(22) Filed: Jan. 24, 2008

(65) Prior Publication Data

US 2008/0116498 A1    May 22, 2008

Related U.S. Application Data

(60) Division of application No. 10/945,147, filed on Sep. 20, 2004, now Pat. No. 7,338,852, which is a continuation of application No. 10/780,416, filed on Feb. 17, 2004, now Pat. No. 6,806,136.

(51) Int. Cl.
*H01L 27/108* (2006.01)
*H01L 29/76* (2006.01)

(52) U.S. Cl. .............................. 257/296; 257/E21.546

(58) Field of Classification Search .................. 257/499, 257/296, E21.546

See application file for complete search history.

(56) References Cited

U.S. PATENT DOCUMENTS

| 5,434,098 A | 7/1995 | Chang |
| 5,618,749 A | 4/1997 | Takahashi et al. |
| 5,656,524 A | 8/1997 | Eklund et al. |
| 6,246,084 B1 | 6/2001 | Kim |

*Primary Examiner*—David S Blum
(74) *Attorney, Agent, or Firm*—Saile Ackerman LLC; Stephen B. Ackerman

(57) ABSTRACT

A semiconductor device comprising the following. A structure having: a capacitor; a first resistor; and a second resistor each within at least a portion of an oxide structure and a metal-oxide semiconductor electrode not within at least a portion of the oxide structure. The capacitor comprising: a lower capacitor first doped polysilicon portion; a capacitor interpoly oxide film portion thereover; and an upper capacitor second doped polysilicon portion over at least a portion of the capacitor interpoly oxide film portion. The first resistor comprising a lower first resistor first doped polysilicon portion and an upper first resistor second doped polysilicon portion thereover. The second resistor comprising a lower second resistor first doped polysilicon portion and an upper interpoly oxide film portion thereover. The metal-oxide semiconductor electrode comprising a lower metal-oxide semiconductor first doped polysilicon portion and an upper metal-oxide semiconductor second doped polysilicon portion thereover.

28 Claims, 2 Drawing Sheets

METHOD OF FORMING A SEMICONDUCTOR DEVICE HAVING A CAPACITOR AND A RESISTOR

This is a Divisional application of U.S. Ser. No. 10/945,147 filed on Sep. 20, 2004 now issued as U.S. Pat. No. 7,338,852, which is a Continuation of U.S. Ser. No. 10/780,416 filed on Feb. 17, 2004, now issued as U.S. Pat. No. 6,806,136.

FIELD OF THE INVENTION

The present invention relates generally to semiconductor fabrication and more specifically to simultaneous formation of capacitors, resistors and metal-oxide semiconductors.

BACKGROUND OF THE INVENTION

Analog integrated circuits may include active elements such as metal-oxide semiconductors and passive elements such as capacitors and resistors formed on a semiconductor substrate and interconnected by wiring patterns.

U.S. Pat. No. 6,246,084 B1 to Kim describes a method for fabricating a capacitor and resistor over a shallow trench isolation (STI) structure.

U.S. Pat. No. 5,618,749 to Takahashi et al. describes another method for fabricating a capacitor and resistor over a shallow trench isolation (STI) structure.

U.S. Pat. No. 5,434,098 to Chang describes a capacitor process with an interpoly oxide (IPO) layer.

U.S. Pat. No. 5,656,524 to Eklund et al. describes a method of forming a polysilicon resistor.

SUMMARY OF THE INVENTION

Accordingly, it is an object of one or more embodiments of the present invention to provide improved methods of simultaneously forming a capacitor(s) and resistor(s) on a field oxide film and a metal-oxide semiconductor(s) on a semiconductor substrate.

Other objects will appear hereinafter.

It has now been discovered that the above and other objects of the present invention may be accomplished in the following manner. Specifically, a structure having: an exposed oxide structure; a capacitor region within at least a portion of the exposed oxide structure; a first resistor region within at least a portion of the exposed oxide structure; a second resistor region within at least a portion of the exposed oxide structure; and a metal-oxide semiconductor region not within at least a portion of the exposed oxide structure is provided. A first polysilicon layer is formed over the structure and the exposed oxide structure. The first polysilicon layer is doped to form a doped first polysilicon layer. An interpoly oxide film is formed over the doped first polysilicon layer. The interpoly oxide film is patterned to form: a capacitor interpoly oxide film portion within the capacitor region over the oxide structure; and a second interpoly oxide film portion within the second resistor region over the oxide structure. A second polysilicon layer is formed over the structure. The second polysilicon layer is doped to form a doped second polysilicon layer. The doped second polysilicon layer and the doped first polysilicon layer are patterned to form: within the capacitor region: a lower capacitor doped first polysilicon portion underneath at least a portion of the capacitor interpoly oxide film portion, and an overlying upper capacitor second doped polysilicon portion over at least a portion of the patterned capacitor interpoly oxide film portion; within the first resistor region: a lower first resistor first polysilicon portion and an upper, overlying first resistor second polysilicon portion; within the second resistor region: a lower second resistor first polysilicon portion underneath at least a portion of the second interpoly oxide film portion; and within the metal-oxide semiconductor region: a lower metal-oxide semiconductor first polysilicon portion and an overlying metal-oxide semiconductor second polysilicon portion.

BRIEF DESCRIPTION OF THE DRAWINGS

The present invention will be more clearly understood from the following description taken in conjunction with the accompanying drawings in which like reference numerals designate similar or corresponding elements, regions and portions and in which.

DETAILED DESCRIPTION OF THE PREFERRED EMBODIMENT

Figure 1:
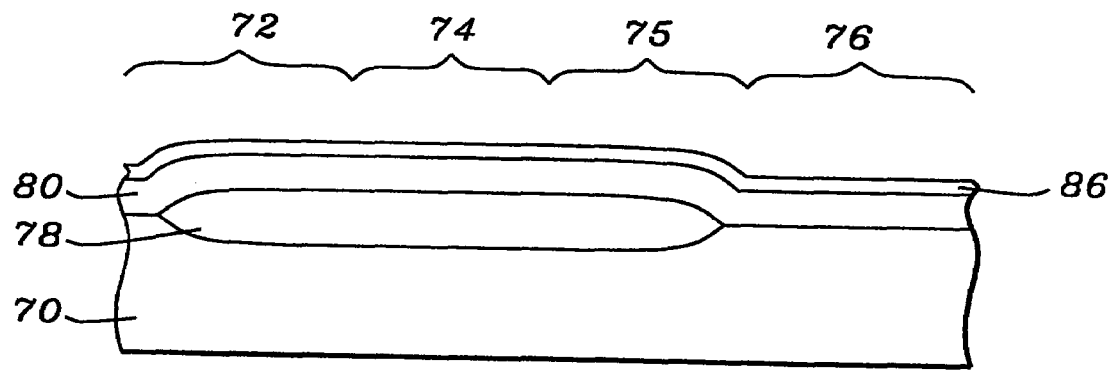
FIGS. 1 to 4 schematically illustrate a preferred embodiment of the present invention.

Initial Structure—FIG. 1

As shown in FIG. 1, structure 70 includes an exposed oxide structure 78 formed therein. Structure 70 includes a capacitor region 72 including at least a portion of the oxide structure 78, a first resistor region 74 including at least a portion of the oxide structure 78, a second resistor region 75 including at least a portion of the oxide structure 78 and a metal-oxide semiconductor (MOS) region 76 that does not include a portion of the oxide structure 78.

Oxide structure 78 is preferably a field oxide (FOX) film having a thickness of preferably from about 4000 to 7500 Å and more preferably from about 4000 to 5500 Å.

Structure 70 is preferably a silicon (Si), germanium (Ge) or gallium arsenide (GaAs) substrate, is more preferably a silicon substrate.

A first polysilicon layer 80 is formed over structure 70 and exposed oxide structure 78 to a thickness of preferably from about 1000 to 2500 Å and more preferably from about 1500 to 2000 Å. The first polysilicon layer 80 is then doped, preferably with phosphorus (P) or arsenic (As) and more preferably with phosphorus (P) to a concentration of preferably from about 1E16 to 1E21 atoms/cm$^2$ and more preferably from about 1E18 to 1E20 atoms/cm$^2$.

An interpoly oxide (IPO) film 86 is formed over the doped first polysilicon layer 80 to a thickness of preferably from about 250 to 600 Å and more preferably from about 300 to 450 Å.

Figure 2:
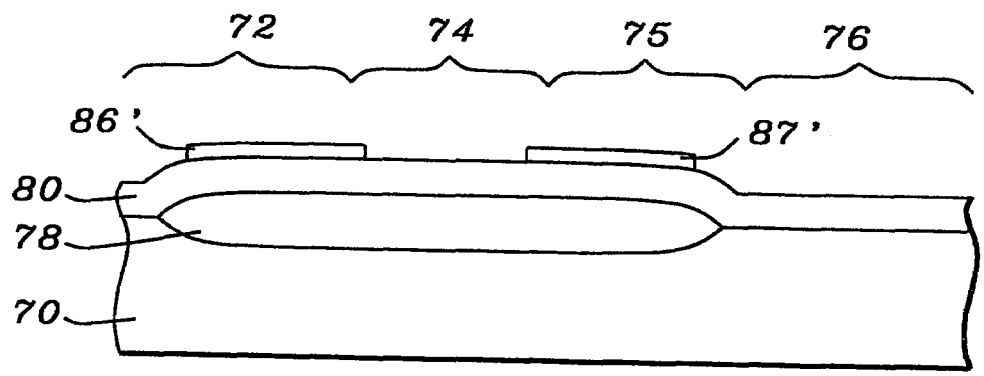

Patterning of IPO Film 86—FIG. 2

As shown in FIG. 2, the IPO film 86 is patterned to form:

a capacitor IPO film portion 86' within the capacitor region 72 over the oxide structure 78; and a second IPO film portion 87' within the second resistor region 75 over the oxide structure 78.

Figure 3:
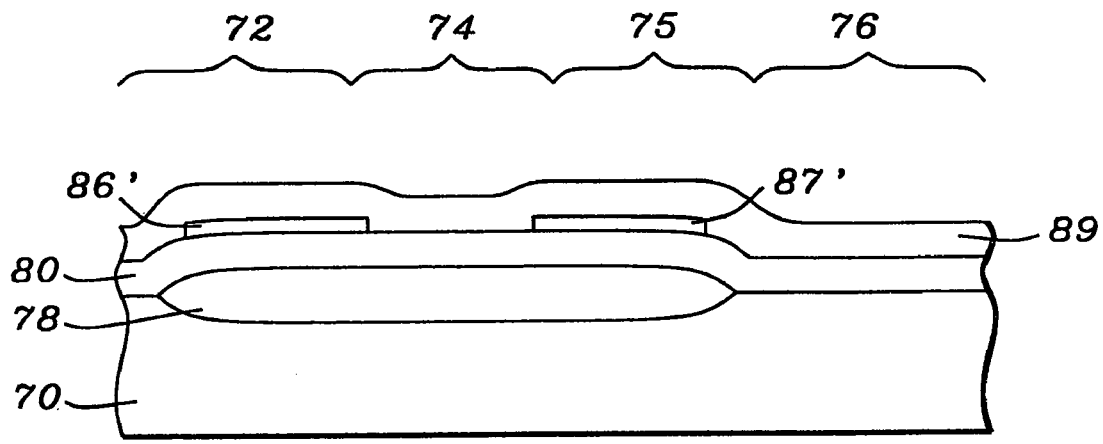

Formation of Second Polysilicon Layer 89—FIG. 3

As shown in FIG. 3, a second polysilicon layer 89 is formed over first doped polysilicon layer 80 and IPO film portions 86', 87' to a thickness of preferably from about 1000 to 2500 Å and more preferably from about 1500 to 2000 Å. The second polysilicon layer 89 is then doped, preferably with phosphorus (P) or arsenic (As) and more preferably with phosphorus (P) to a concentration of preferably from about 1E19 to 1E21 atoms/cm$^2$ and more preferably from about 5E19 to 5E20 atoms/cm$^2$.

Figure 4:
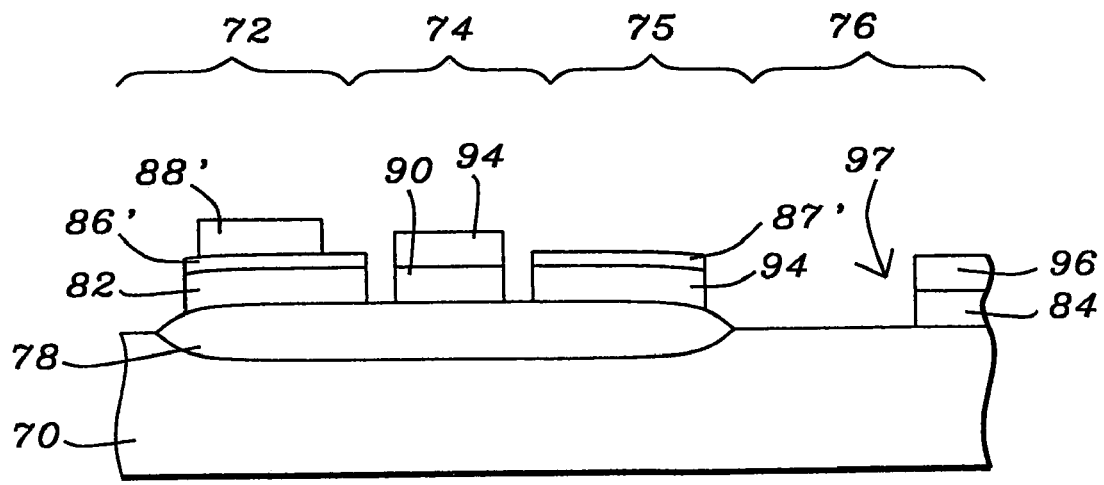

Patterning of Second Doped Polysilicon Layer 89 and First Doped Polysilicon Layer 80—FIG. 4

As shown in FIG. 4, the second doped polysilicon layer 89 and first doped polysilicon layer 80 are patterned to form:

within capacitor region 72: a lower capacitor doped first polysilicon portion 82 underneath at least a portion of capacitor IPO film portion 86', and an overlying upper capacitor second doped polysilicon portion 88' over at least a portion of the patterned capacitor IPO film portion 86';

within first resistor region 74: a lower first resistor first polysilicon portion 90 and an upper, overlying first resistor second polysilicon portion 94;

within second resistor region 75: a lower second resistor first polysilicon portion 94 underneath at least a portion of second IPO film portion 87'; and within MOS region 76: a lower MOS first polysilicon portion 84 and an overlying MOS second polysilicon portion 96 that comprise a MOS electrode 97.

It is noted that one or more capacitors and/or MOSs; and two or more resistors may be formed in accordance with the teachings of the third embodiment of the present invention.

Further processing may then proceed.

Advantages of the Present Invention

The advantages of one or more embodiments of the present invention include:
1. the total thickness of the first polysilicon and second polysilicon is thinner than prior art, it can increase process throughput and save process cost;
2. the thickness of first polysilicon is thinner, so the topography is plainer than prior art, it is helpful to photo process due to the wider photo DOF window;
3. it is easy to integrate polycide module, we can use polycide (e.g. WSi) film to replace second polysilicon, and then we can implement a polycide gate process; and
4. there are two kinds of resistors, one is formed by first polysilicon, and the other one is formed by the combination of first and second polysilicon.

While particular embodiments of the present invention have been illustrated and described, it is not intended to limit the invention, except as defined by the following claims.

I claim:
1. A semiconductor device, comprising:
 a) a structure having an oxide structure; the structure having a capacitor region within at least a portion of the oxide structure; a first resistor region within at least a portion of the oxide structure; a second resistor region within at least a portion of the oxide structure; and a metal-oxide semiconductor region not within at least a portion of the oxide structure;
 b) a capacitor within the capacitor region; the capacitor comprising:
  i) a lower capacitor first doped polysilicon portion over the oxide structure;
  ii) a capacitor interpoly oxide film portion over the lower capacitor doped first polysilicon portion; and
  iii) an upper capacitor second doped polysilicon portion over at least a portion of the capacitor interpoly oxide film portion;
 c) a first resistor within the first resistor region; the first resistor comprising:
  i) a lower first resistor first doped polysilicon portion over the oxide structure;
  ii) an upper first resistor second doped polysilicon portion over the lower first resistor first doped polysilicon portion;
 d) a second resistor within the second resistor region; the second resistor comprising:
  i) a lower second resistor first doped polysilicon portion over the oxide structure;
  ii) an upper interpoly oxide film portion over the lower second resistor first doped polysilicon portion; and
 e) a metal-oxide semiconductor electrode within the metal-oxide semiconductor region; the metal-oxide semiconductor electrode comprising:
  i) a lower metal-oxide semiconductor first doped polysilicon portion over the oxide structure; and
  ii) an upper metal-oxide semiconductor second doped polysilicon portion over the lower metal-oxide semiconductor first doped polysilicon portion.

2. The device of claim 1, wherein the structure is a substrate and the oxide structure is a field oxide film.

3. The device of claim 1, wherein the structure is a silicon substrate, a germanium substrate or a gallium arsenide substrate.

4. The device of claim 1, wherein the structure is a silicon substrate.

5. The device of claim 1, wherein the oxide structure has a thickness of from about 4000 to 7500 Å, the doped first polysilicon portions have a thickness of from about 1000 to 2500 Å, the interpoly oxide film portions have a thickness of from about 250 to 600 Å, and the doped second polysilicon portions have a thickness of from about 1000 to 2500 Å.

6. The device of claim 1, wherein the oxide structure has a thickness of from about 4000 to 5500 Å, the doped first polysilicon portions have a thickness of from about 1500 to 2000 Å, the interpoly oxide film portions have a thickness of from about 300 to 450 Å, and the doped second polysilicon portions have a thickness of from about 1500 to 2000 Å.

7. The device of claim 1, wherein the doped first polysilicon portions are doped with a phosphorus dopant or an arsenic dopant; and the doped second polysilicon portions are doped with a phosphorus dopant or an arsenic dopant.

8. The device of claim 1, wherein the doped first polysilicon portions are doped with a phosphorus dopant; and the doped second polysilicon portions are doped with a phosphorus dopant.

9. The device of claim 1, wherein the doped first polysilicon portions are doped to a concentration of from about 1E16 to 1E21 atoms/cm$^2$; and the doped second polysilicon portions are doped to a concentration of from about 1E19 to 1E21 atoms/cm$^2$.

10. The device of claim 1, wherein the doped first polysilicon portions are doped to a concentration of from about 1E18 to 1E20 atoms/cm$^2$; and the doped second polysilicon portions are doped to a concentration of from about 5E19 to 5E20 atoms/cm$^2$.

11. A semiconductor device, comprising:
 a) a substrate having an field oxide film; the substrate having a capacitor region within at least a portion of the field oxide film; a first resistor region within at least a portion of the field oxide film; a second resistor region within at least a portion of the field oxide film; and a metal-oxide semiconductor region not within at least a portion of the field oxide film;
 b) a capacitor within the capacitor region; the capacitor comprising:
  i) a lower capacitor first doped polysilicon portion over the field oxide film;
  ii) a capacitor interpoly oxide film portion over the lower capacitor doped first polysilicon portion; and iii) an upper capacitor second doped polysilicon portion over at least a portion of the capacitor interpoly oxide film portion;
c) a first resistor within the first resistor region; the first resistor comprising:
  i) a lower first resistor first doped polysilicon portion over the field oxide film;
  ii) an upper first resistor second doped polysilicon portion over the lower first resistor first doped polysilicon portion;
d) a second resistor within the second resistor region; the second resistor comprising:
  i) a lower second resistor first doped polysilicon portion over the field oxide film;
  ii) an upper interpoly oxide film portion over the lower second resistor first doped polysilicon portion; and
e) a metal-oxide semiconductor electrode within the metal-oxide semiconductor region; the metal-oxide semiconductor electrode comprising:
  i) a lower metal-oxide semiconductor first doped polysilicon portion over the field oxide film; and
  ii) an upper metal-oxide semiconductor second doped polysilicon portion over the lower metal-oxide semiconductor first doped polysilicon portion.

12. The device of claim 11, wherein the substrate is a silicon substrate, a germanium substrate or a gallium arsenide substrate.

13. The device of claim 11, wherein the substrate is a silicon substrate.

14. The device of claim 11, wherein the field oxide film has a thickness of from about 4000 to 7500 Å, the doped first polysilicon portions have a thickness of from about 1000 to 2500 Å, the interpoly oxide film portions have a thickness of from about 250 to 600 Å, and the doped second polysilicon portions have a thickness of from about 1000 to 2500 Å.

15. The device of claim 11, wherein the field oxide film has a thickness of from about 4000 to 5500 Å, the doped first polysilicon portions have a thickness of from about 1500 to 2000 Å, the interpoly oxide film portions have a thickness of from about 300 to 450 Å, and the doped second polysilicon portions have a thickness of from about 1500 to 2000 Å.

16. The device of claim 11, wherein the doped first polysilicon portions are doped with a phosphorus dopant or an arsenic dopant; and the doped second polysilicon portions are doped with a phosphorus dopant or an arsenic dopant.

17. The device of claim 11, wherein the doped first polysilicon portions are doped with a phosphorus dopant; and the doped second polysilicon portions are doped with a phosphorus dopant.

18. The device of claim 11, wherein the doped first polysilicon portions are doped to a concentration of from about 1E16 to 1E21 atoms/cm$^2$; and the doped second polysilicon portions are doped to a concentration of from about 1E19 to 1E21 atoms/cm$^2$.

19. The device of claim 11, wherein the doped first polysilicon portions are doped to a concentration of from about 1E18 to 1E20 atoms/cm$^2$; and the doped second polysilicon portions are doped to a concentration of from about 5E19 to 5E20 atoms/cm$^2$.

20. A semiconductor device, comprising:
a) a structure having an oxide structure; the structure having a capacitor region within at least a portion of the oxide structure; a first resistor region within at least a portion of the oxide structure; a second resistor region within at least a portion of the oxide structure; and a metal-oxide semiconductor region not within at least a portion of the oxide structure;
b) a capacitor within the capacitor region; the capacitor comprising:
  i) a lower capacitor first doped polysilicon portion over the oxide structure;
  ii) a capacitor interpoly oxide film portion over the lower capacitor doped first polysilicon portion; and
  iii) an upper capacitor second doped polysilicon portion over at least a portion of the capacitor interpoly oxide film portion;
c) a first resistor within the first resistor region; the first resistor comprising:
  i) a lower first resistor first doped polysilicon portion over the oxide structure;
  ii) an upper first resistor second doped polysilicon portion over the lower first resistor first doped polysilicon portion;
d) a second resistor within the second resistor region; the second resistor comprising:
  i) a lower second resistor first doped polysilicon portion over the oxide structure;
  ii) an upper interpoly oxide film portion over the lower second resistor first doped polysilicon portion; and
e) a metal-oxide semiconductor electrode within the metal-oxide semiconductor region; the metal-oxide semiconductor electrode comprising:
  i) a lower metal-oxide semiconductor first doped polysilicon portion over the oxide structure; and
  ii) an upper metal-oxide semiconductor second doped polysilicon portion over the lower metal-oxide semiconductor first doped polysilicon portion;
wherein the doped first polysilicon portions are doped to a concentration of from about 1E16 to 1E21 atoms/cm$^2$; and the doped second polysilicon portions are doped to a concentration of from about 1E19 to 1E21 atoms/cm$^2$.

21. The device of claim 20, wherein the structure is a substrate and the oxide structure is a field oxide film.

22. The device of claim 20, wherein the structure is a silicon substrate, a germanium substrate or a gallium arsenide substrate.

23. The device of claim 20, wherein the structure is a silicon substrate.

24. The device of claim 20, wherein the oxide structure has a thickness of from about 4000 to 7500 Å, the doped first polysilicon portions have a thickness of from about 1000 to 2500 Å, the interpoly oxide film portions have a thickness of from about 250 to 600 Å, and the doped second polysilicon portions have a thickness of from about 1000 to 2500 Å.

25. The device of claim 20, wherein the oxide structure has a thickness of from about 4000 to 5500 Å, the doped first polysilicon portions have a thickness of from about 1500 to 2000 Å, the interpoly oxide film portions have a thickness of from about 300 to 450 Å, and the doped second polysilicon portions have a thickness of from about 1500 to 2000 Å.

26. The device of claim 20, wherein the doped first polysilicon portions are doped with a phosphorus dopant or an arsenic dopant; and the doped second polysilicon portions are doped with a phosphorus dopant or an arsenic dopant.

27. The device of claim 20, wherein the doped first polysilicon portions are doped with a phosphorus dopant; and the doped second polysilicon portions are doped with a phosphorus dopant.

28. The device of claim 20, wherein the doped first polysilicon portions are doped to a concentration of from about 1E18 to 1E20 atoms/cm$^2$; and the doped second polysilicon portions are doped to a concentration of from about 5E19 to 5E20 atoms/cm$^2$

* * * * *